(12) United States Patent
Josse

(10) Patent No.: US 6,426,242 B1
(45) Date of Patent: Jul. 30, 2002

(54) SEMICONDUCTOR CHIP PACKAGING METHOD

(75) Inventor: Emile Josse, Tours (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/565,936

(22) Filed: May 5, 2000

(30) Foreign Application Priority Data

May 12, 1999 (FR) .............................................. 99 06244

(51) Int. Cl.⁷ ..................... H01L 21/44; H01L 21/48; H01L 21/50; H01L 23/48

(52) U.S. Cl. ..................... 438/110; 438/928; 257/688

(58) Field of Search ................ 438/125, 928, 438/110; 257/688

(56) References Cited

U.S. PATENT DOCUMENTS 6,326,697 B1 * 12/2001 Farnworth .................. 257/779

* cited by examiner

Primary Examiner—Tuan H. Nguyen
Assistant Examiner—Nema Berezny
(74) Attorney, Agent, or Firm—Wolf, Greenfield & Sacks, P.C.; James H. Morris

(57) ABSTRACT

A method of packaging a chip made in a semiconductor wafer. The method includes providing, on a first surface of the wafer, a conductive area extending beyond the periphery of the chip; adding a first thick plate including an electrically isolating material on the first surface; etching the conductive layer from a second surface of the wafer and depositing a conductive track extending from a contact of the second chip surface to the exposed surface of the conductive area; covering the second surface with a second thick plate forming a rigid cap; and etching the first plate above the conductive layer to deposit thereon a conductive material extending, in the form of a track, to the exposed surface of the first plate.

18 Claims, 3 Drawing Sheets

SEMICONDUCTOR CHIP PACKAGING METHOD

BACKGROUND OF THE INVENTION

1. Field of the Invention

The present invention relates to the packaging of a semiconductor chip, more specifically for assembly on a printed circuit board. The present invention applies to components for which it is necessary to provide at least one electric contact on the rear surface of the semiconductor chip.

2. Discussion of the Related Art

To continue the trend of electronic device miniaturization, it is attempted to reduce the bulk of a component, a non-negligible part of which is due to its protective package. This trend to miniaturize packaging has resulted, for integrated circuits, in attempting to eliminate packages based on an encapsulation, in a material such as an epoxy resin, of a chip placed on a connection grid. An example of a known technique consists of enclosing the chip between a silicon plate and a glass plate, and etching the glass plate to form openings enabling access to contacts at the so-called upper or front chip surface. This type of package is known as CSP and is presently only used for integrated circuits in which contacts are only provided at the front chip surface.

It would be desirable to be able to also take advantage of the progress of package miniaturization for chips having contacts on both surfaces.

SUMMARY OF THE INVENTION

Thus, an object of the present invention is to provide a novel method of packaging a semiconductor chip having contacts on both surfaces, which enables a transfer of the contacts onto a single surface of the package while reducing or minimizing the surface of this package.

The present invention also aims at providing a solution that enables obtaining a package of low height.

The present invention also aims at providing a solution that can be implemented for discrete components as well as for integrated circuits.

To achieve these and other objects, the present invention provides a method of packaging a chip formed in a semiconductor wafer and having electric contacts on both its surfaces, including the steps of providing, on a first surface of the wafer, at least one conductive area extending beyond the periphery of the chip to be formed; gluing a first thick plate including an electrically isolating material on the first surface; etching the wafer from its second surface to define chips; depositing at least one conductive track extending from a contact of the second chip surface to the conductive area; covering the second surface with a second thick plate forming a rigid cap with an interposed isolating filling material between the first and second plates; and etching the first plate at least above the conductive layer to deposit thereon a conductive material extending, in the form of a track, to the exposed surface of the first plate.

According to an embodiment of the present invention, the method further includes a final cutting step to separate the packages.

According to an embodiment of the present invention, the first isolating plate is thinned before being opened above the conductive area.

According to an embodiment of the present invention, the second surface of the wafer is thinned before the step of chip definition etching.

According to an embodiment of the present invention, the thickness of the second covering plate is chosen according to the desired mechanical bond of the package once completed.

According to an embodiment of the present invention, the etching of the first thick plate is performed according to a pattern of formation of two pads per chip.

According to an embodiment of the present invention, the contact transfer from the conductive area is performed in a separation area of the two pads, to the exposed surface of one of the pads.

According to an embodiment of the present invention, the second plate is made of an electrically isolating material.

According to an embodiment of the present invention, the second plate is, at least partially, made of a thermally conductive material.

The foregoing objects, features and advantages of the present invention, will be discussed in detail in the following non-limiting description of specific embodiments in connection with the accompanying drawings.

DETAILED DESCRIPTION

Figure 1:
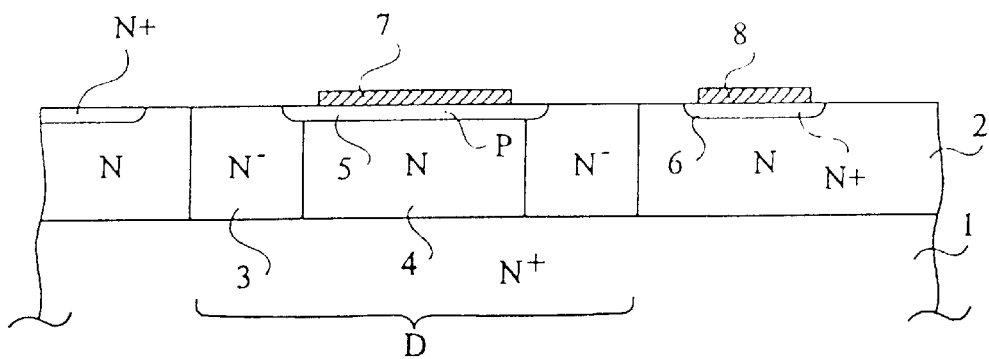
FIG. 1 is a very simplified partial cross-section view of an example of a semiconductor component to which the packaging method of the present invention applies.

The same elements have been designated by the same references in the different drawings. For clarity, the representations of the drawings are not to scale and only those elements that are necessary to the understanding of the present invention have been shown in the drawings and will be described hereafter.

FIG. 1 shows an example of a semiconductor component to which the method of the present invention can apply. The representation of FIG. 1 corresponds to a partial cross-section view of a silicon wafer, after the different doping steps have been performed.

FIG. 1 shows a zener diode. An N-doped epitaxial layer 2 has been formed on an N+-doped silicon substrate 1. An N⁻-doped ring region 3 extends over the entire thickness of epitaxial layer 2, and delimits a central region 4 of layer 2. A heavily-doped P-type region 5 is formed on a small thickness of layer 2 in region 4 and ends in ring 3. The junction between regions 4 and 5 forms the zener diode, the cathode of which corresponds to substrate 1.

An N+-doped region 6 in the form of a ring surrounding the structure, performed by implantation from the front surface of the wafer, is generally provided. This optional region 6 has the function of avoiding a lateral propagation of impurities from the outside, as will be seen hereafter.

In a conventional structure, once all implantations have been so performed, the rear surface of the silicon wafer is coated with a cathode metallization.

The method of the present invention is implemented on an entire wafer before cutting to individualize the different components.

A metal layer is formed on the front surface and etched to form anode contact metallizations 7 and metallizations 8 external to ring 3.

Figure 2:
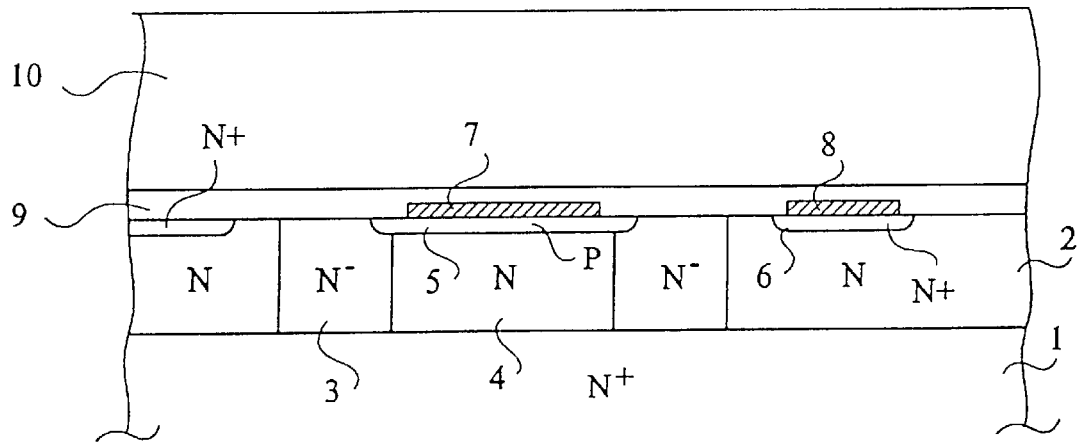
FIG. 2 shows the component of FIG. 1 at the end of a first step of the packaging method according to the present invention.

FIG. 2 shows the structure at the end of a first step of formation of the package according to the present invention.

This first step includes applying, on the front surface of wafer 1 and with an interposed glue layer 9, a plate 10 made of an electrically isolating material, for example, glass. Layer 9 aims at not only attaching plate 10, but also absorbing the surface roughs (in particular, linked to metallizations 7 and 8). The thickness of plate 10 is chosen to provide a good mechanical bond to the structure in the subsequent steps of the method. Preferably, the thickness of this plate is several hundred micrometers, for example, from 200 to 500 µm.

Figure 3:
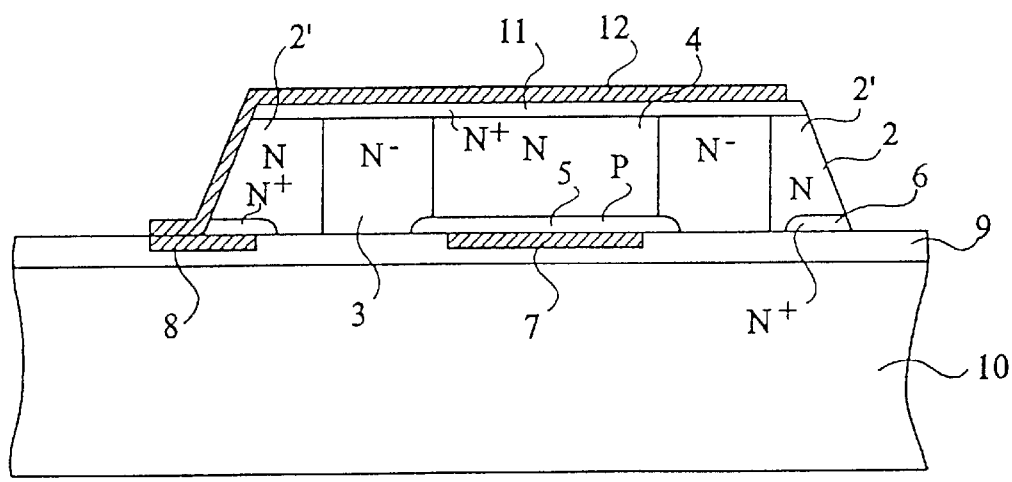
FIG. 3 shows the component of FIG. 2 at the end of a second step of the method according to the present invention.

FIG. 3 shows the structure of FIG. 2 at the end of a second step of the method according to the present invention. In FIG. 3, the structure is shown to be turned with respect to FIG. 2. For the entire second step of the method, the mechanical stand is plate 10. This second step of the method of the present invention is divided into three phases.

In a first phase, the rear surface of silicon wafer 1 is rectified, for example by grinding, by leaving in place a small thickness 11 of substrate 1. The thickness of epitaxial layer 2 that is not altered and conventionally depends on the desired performance for the product and is generally of several tens of micrometers for vertical power components, for example, from 10 to 70 µm.

In a second phase, the external periphery of epitaxial layer 2 is removed to reach late 10, to obtain individual chips of a desired contour. In the example shown, there remains an N-doped region 2' around N$^-$-doped ring 3. Further, the etch pattern is such hat, on one side of the structure, metallization 8 is at least partially exposed. The position of regions 6 will have been chosen for these regions to emerge at the chip periphery to ensure their function of stopping the propagation of impurities.

The chips are preferably delimited by etching so that the lateral surfaces are slanted to ease a subsequent metal deposition.

In a third phase, a metallization that extends over the entire upper surface of the structure is deposited, as illustrated in FIG. 3. The metallization is etched to leave in place an area 12 that at least partially covers region 11 above the diode junction, a slice of epitaxial layer 2, and metallization 8.

Figure 4:
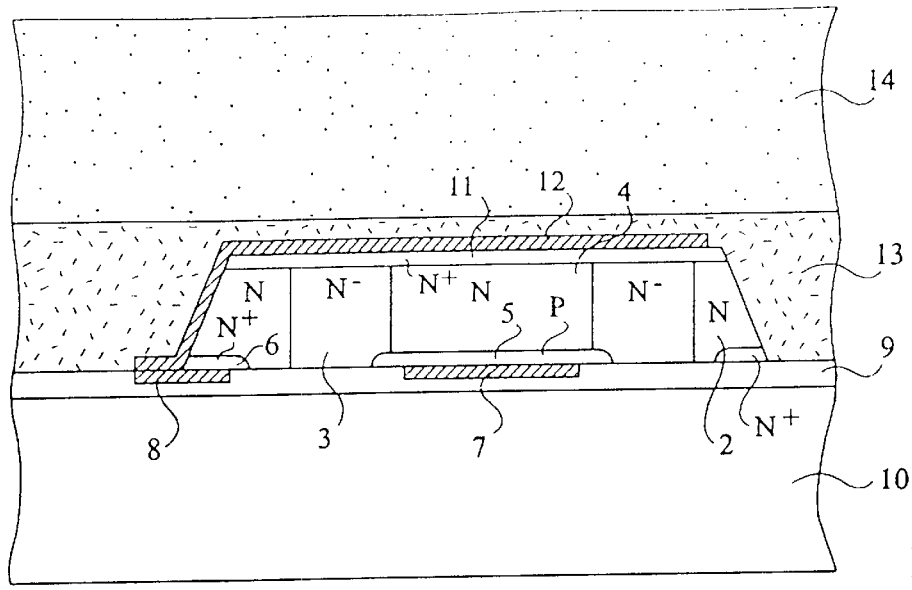
FIG. 4 shows the component of FIG. 3 at the end of a third step of the method according to the present invention.

FIG. 4 shows the component of FIG. 3 at the end of a third step of the method of the present invention. This third step includes two phases.

In a first phase, the entire structure is covered with an encapsulation material 13 of epoxy resin type. The thickness of layer 13 is such that the resin covers rear surface metallization areas 12 of the components. It will be ascertained that the resin distributes between the different components supported by plate 10, that is, in all the trenches formed in epitaxial layer 2, and that the air is removed from the trenches.

In a second phase of the third step illustrated in FIG. 4, the entire structure is covered with a relatively thick plate 14, for example, made of silicon. The thickness of plate 14 is chosen to give the end product a sufficient mechanical hold. Indeed, according to the present invention, plate 14 forms, as will be seen hereafter, the package cap. The thickness of plate 14 is of several hundreds of micrometers, for example between 200 and 800 µm.

It should be noted that materials other than silicon may be chosen to form covering plate or cap 14. A second glass plate may, for example, be used, or any other material adapted to providing to the end product a sufficient mechanical bond for the smallest possible thickness. Silicon has the advantage of being easily cut and of raising no problem of differential expansion with the chip.

Figure 5A:
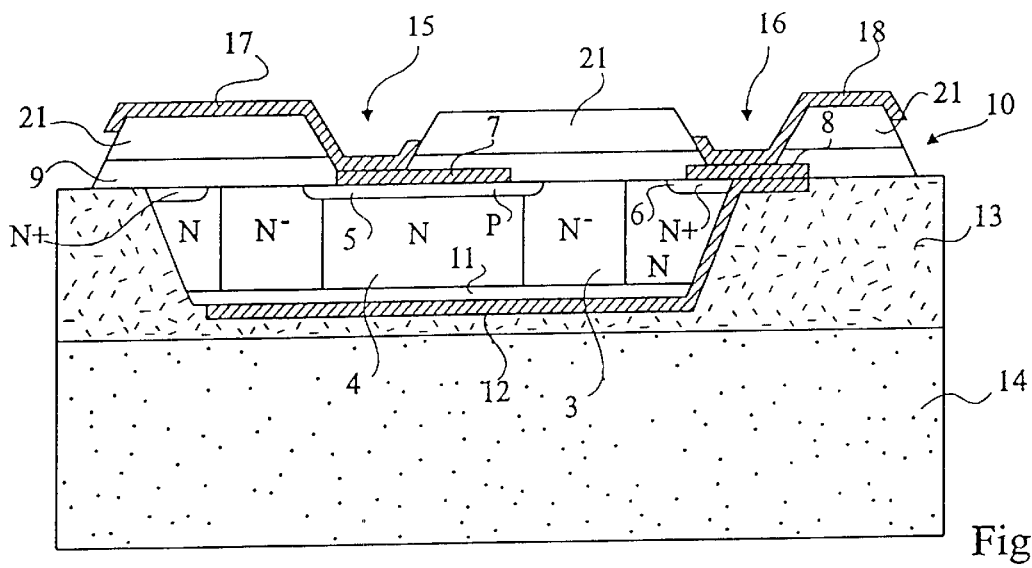
FIGS. 5A and 5B show, respectively in cross-section and bottom view, the packaged component.
Figure 5B:
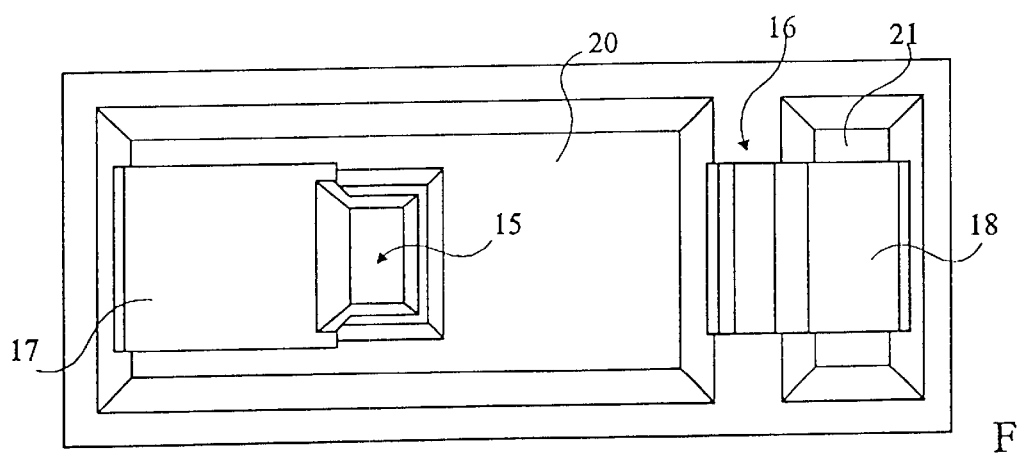

FIGS. 5A and 5B show, respectively in cross-section and in bottom view, a packaged semiconductor component according to the present invention. These drawings illustrate a fourth step of the method of forming a package according to the present invention. In FIG. 5A, the component has been shown to be turned with respect to FIGS. 3 and 4, in the same direction as in FIGS. 1 and 2. This fourth step includes two phases.

In a first phase, the thickness of plate 10 is reduced to reach the smallest possible value while providing a sufficient protection to the end product, especially in terms of electric isolation. The thickness of plate 10 may thus be brought down to a few tens of micrometers, for example, a thickness ranging between 10 and 50 µm. The final function of the remaining areas of plate 10 is to form an isolation layer separating the different electric contacts to be transferred from the component to a printed circuit on which said component is to be assembled.

Isolating plate 10 is then locally etched at the periphery of the different components and to define at least two openings 15, 16 of access to metallizations 7 and 8.

As more particularly appears from FIG. 5B, the etching of plate 10 is preferably performed to leave, for each component, two isolating pads, respectively 20 and 21. Pad substantially covers the entire component surface (here, diode D). Opening 15 formed in pad 20 enables the contact recovery on metallization 7. Opening 16 enabling the contact recovery on metallization 8 has the shape of a trench separating pad 20 from pad 21.

In a second phase of the fourth step, a conductive layer (for example, a gold or tin layer) is deposited, which also deposits at the bottom of openings 15 and 16 formed in plate 10 to contact metallizations 7 and 8. This conductive material layer is etched according to a pattern going from the bottom of openings 15 and 16 to the exposed surface of pads 20 and 21, to form contacts, respectively 17 and 18, of connection of the completed package.

There only remains, in a fifth step, to cut up plate 14 to individualize the components and obtain a finished product such as illustrated in FIGS. 5A and 5B. It should be noted that there remains no glass of plate 10 in the cutting paths, since it has been removed upon formation of pads 20 and 21. This packaged component is ready to be assembled on a printed circuit board, the upper portion of FIG. 5A being directed towards metallized areas of the board.

An advantage of the present invention is that it enables contact transfers without using connection leads that require a thick encapsulation. As a result, the thickness of the finished package is reduced or minimized.

Another advantage of the present invention is that the surface bulk of the packaged component is only very slightly greater than its active surface.

Another advantage of the present invention is that its implementation is compatible with conventional methods of semiconductor component manufacturing. In particular, all the steps of the method of the present invention are performed on entire wafers, which improves or optimizes the output.

According to an alternative embodiment, it may be provided to reduce the thickness of silicon cap 14 to associate therewith a metal plate, relatively thick as compared to the thin metallization layers, intended for forming a heat dissipator. The maintaining or not of a thickness of plate 14 depends on the application and, in particular, on the possible need for electric isolation between the heat dissipator and the rear chip surface.

Figure 6A:
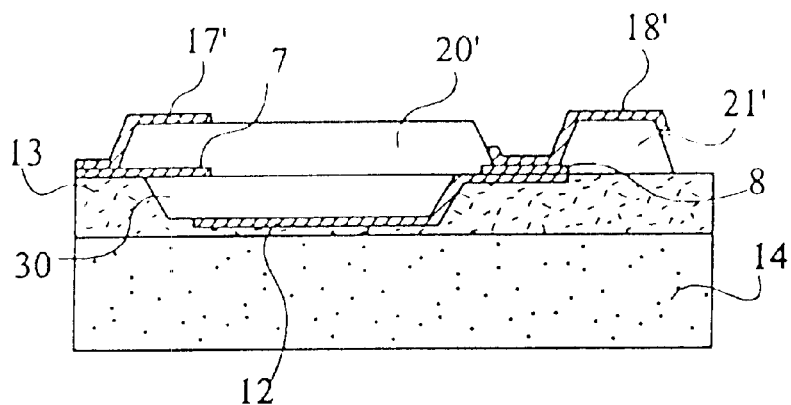
FIGS. 6A and 6B very schematically show, respectively in cross-section and in bottom view, an embodiment of the present invention applied to an integrated circuit chip.
Figure 6B:
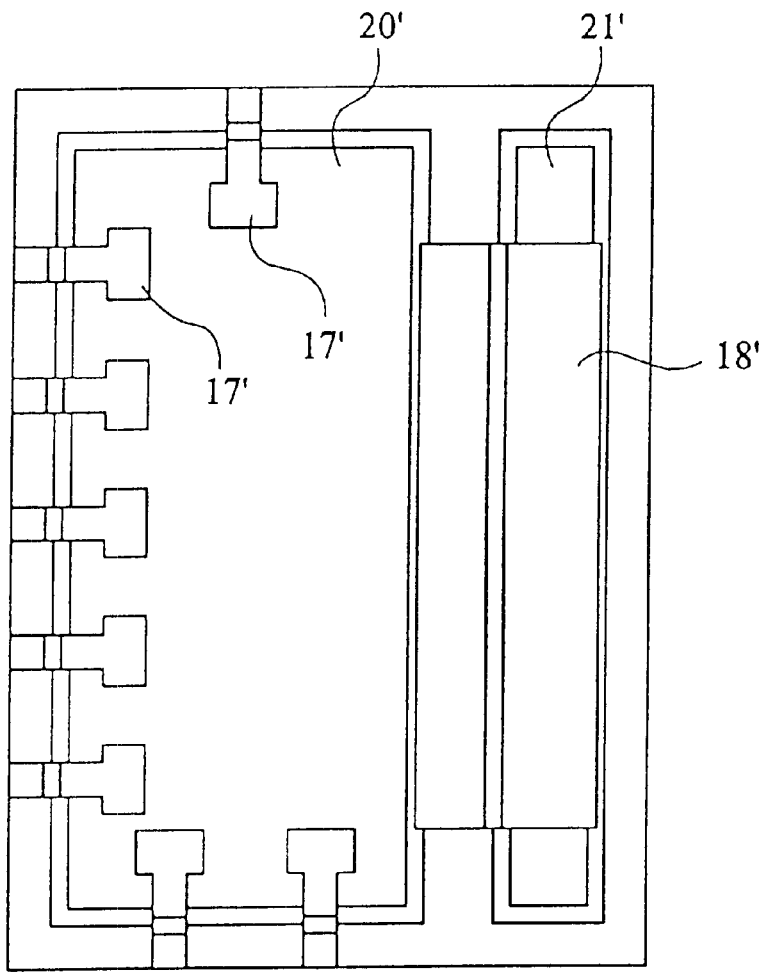

FIGS. 6A and 6B very schematically illustrate, respectively in cross-section and in bottom view, an integrated circuit packaged by the method according to the present invention.

The application of the method according to the present invention to an integrated circuit chip 30 is performed similarly to the embodiment described in relation with FIGS. 1 to 5. In the case of an integrated circuit, the present invention more specifically applies to the case where at least one contact has to be transferred from the rear surface of the integrated circuit, for example, to at least one buried layer. As in the first embodiment, the contact transfer is performed by means of an area 12 etched in a metallization layer and contacting, on the one hand, the rear surface of chip 30 and, on the other hand, a metallization area 8 deposited at the same time as one or several front surface contacting areas 7.

As in the preceding embodiment, the electric isolation of the different contacts is performed by means of two pads 20' and 21', for example made of glass. Similarly, the mechanical protection of the integrated circuit is ensured by a cap 14, for example made of silicon, on the rear surface of chip 30 with an interposed encapsulation material layer 13.

A difference in the implementation of the method of the present invention applied to an integrated circuit is that, to contact metallizations 7 deposited on the conductive pads of chip 30, it is not necessary to form openings in glass pad 20'. It is possible, as illustrated in FIG. 6A, to only etch, in the conductive layer deposited on glass pads 20' and 21', conductive tracks 17' joining, by the outside of pad 20', an end left exposed of areas 7. On the side of the contact recovery on rear surface 8, the contact transfer to the top of pad 21' is performed by means of a track 18', as in the preceding embodiment.

Of course, the present invention is likely to have various alterations, modifications, and improvements which will readily occur to those skilled in the art. In particular, adapting the method of the present invention to the packaging of semiconductor components other than a diode such as illustrated in FIGS. 1 to 5 is within the abilities of those skilled in the art based on the functional indications given hereabove. It should be noted that the present invention allows the realization of several contact transfers from the rear surface. It is sufficient, to achieve this, to etch the metallization layer used to form area 12 differently, to form several tracks transferred by the edges of the silicon chip to the front surface. Further, the dimensional indications given hereabove as an example may be modified, in particular, according to the desired mechanical bond and to the chip surface, and according to thickness constraints linked, for example, to the breakdown voltage of the component.

Those skilled in the art will appreciate that the present invention also comprises a package obtained by the disclosed method.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for packaging a chip formed in a semiconductor wafer and having electric contacts on both its surfaces, including the steps of:
   providing, on a first surface of the wafer, at least one conductive area extending beyond the periphery of the chip to be formed;
   gluing a first thick plate including an electrically isolating material on the first surface;
   etching the wafer from its second surface to define chips;
   depositing at least one conductive track extending from a contact of the second chip surface to the conductive area;
   covering the second surface with a second thick plate forming a rigid cap with an interposed isolating filling material between the first and second plates; and
   etching the first plate at least above the at least one conductive area to deposit thereon a conductive material extending, in the form of a track, to the exposed surface of the first plate.

2. The method of claim 1, further including a final cutting step to separate the packages.

3. The method of claim 1, wherein the first isolating plate is thinned before being opened above the conductive area.

4. The method of claim 1, wherein the second surface of the wafer is thinned before the step of chip definition etching.

5. The method of claim 1, wherein the thickness of the second covering plate is chosen according to the desired mechanical bond of the package once completed.

6. The method of claim 1, wherein the etching of the first thick plate is performed according to a pattern of formation of two pads per chip.

7. The method of claim 6, wherein a contact transfer from the conductive area is performed in an separation area of the two pads, to the exposed surface of one of the pads.

8. The method of claim 1, wherein the second plate is made of an electrically isolating material.

9. The method of claim 1, wherein the second plate is, at least partially, made of a thermally conductive material.

10. A method for packaging a chip formed in a semiconductor wafer and having electric contacts on both its surfaces, including the steps of:
    providing, on a first surface of the wafer, at least one conductive area extending beyond the periphery of the chip to be formed; and
    applying a first plate on the first surface; and
    etching the wafer from a second surface of the wafer to define a chip; and
    depositing at least one conductive layer extending from a contact of the second surface to the at least one conductive area; and
    covering the second surface with a second plate; and
    etching the first plate at least above the at least one conductive area to provide at least a first etched portion; and
    depositing a conductive material over the first etched portion and extending to a first surface of the first plate outside the first etched portion, wherein the conductive material forms a first conductance path from the at least one conductive area to the first surface of the first plate.

11. The method of claim 10, wherein the first plate includes an electrically isolating material.

12. The method of claim 11, wherein the step of applying the first plate includes gluing the first plate to the first surface.

13. The method of claim 10, further comprising the step of interposing isolating filling material between the first and second plates.

14. The method of claim 10, wherein the second plate forms a rigid cap over the entire second surface.

15. The method of claim 10, wherein the etching the first plate includes etching over a second contact region of the first surface to form a second etched portion.

16. The method of claim 15, wherein depositing the conductive material includes depositing conductive material over the second etched portion and extending to a second surface of the first plate outside the first and second etched portions, wherein the conductive material forms a second conductance path from the contact region to the second surface of the first plate.

17. The method of claim 10, wherein the first surface of the first plate defines a first pad of the chip.

18. The method of claim 16, wherein the first and second surfaces of the first plate outside the first and second etched portions define first and second pads of the chip.

\* \* \* \* \*